(12) United States Patent
Lee et al.

(10) Patent No.: US 7,710,791 B2
(45) Date of Patent: May 4, 2010

(54) INPUT CIRCUIT OF A NON-VOLATILE SEMICONDUCTOR MEMORY DEVICE

(75) Inventors: Kwang-jin Lee, Hwaseong-si (KR); Won-Seok Lee, Suwon-si (KR); Qi Wang, Yongin-si (KR); Hye-Jin Kim, Seoul (KR); Joon Yong Choi, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 11/984,145

(22) Filed: Nov. 14, 2007

(65) Prior Publication Data

US 2008/0112220 A1 May 15, 2008

(30) Foreign Application Priority Data

Nov. 15, 2006 (KR) ...................... 10-2006-0112981

(51) Int. Cl.
G11C 7/10 (2006.01)
G11C 8/06 (2006.01)
G11C 7/22 (2006.01)
G11C 8/18 (2006.01)

(52) U.S. Cl. ............................ 365/189.05; 365/189.09; 365/193; 365/194; 365/230.08; 365/233.1; 365/233.17; 365/225.7

(58) Field of Classification Search ............ 365/189.05, 365/189.09, 193, 194, 230.08, 233.1, 233.17, 365/225.7
See application file for complete search history.

(56) References Cited

U.S. PATENT DOCUMENTS

| | | | | |
|---|---|---|---|---|
| 5,619,456 A | * | 4/1997 | McClure | ................ 365/189.17 |
| 5,801,554 A | * | 9/1998 | Momma et al. | ............... 327/89 |
| 5,838,076 A | * | 11/1998 | Zarrabian et al. | ........... 307/115 |
| 6,064,226 A | | 5/2000 | Earl | |
| 6,137,314 A | | 10/2000 | Buck | |
| 6,247,138 B1 | * | 6/2001 | Tamura et al. | ............... 713/600 |
| 6,529,422 B1 | * | 3/2003 | Mazumder et al. | ...... 365/189.09 |
| 6,643,180 B2 | * | 11/2003 | Ikehashi et al. | ........ 365/185.22 |
| 6,842,385 B2 | * | 1/2005 | Cioaca et al. | .......... 365/189.09 |

(Continued)

FOREIGN PATENT DOCUMENTS

KR        1998-073447        11/1998

(Continued)

*Primary Examiner*—J. H. Hur
(74) *Attorney, Agent, or Firm*—Harness, Dickey & Pierce, P.L.C.

(57) ABSTRACT

A non-volatile semiconductor memory device may include a memory cell array that may include a plurality of memory transistors; a input circuit that may control a voltage level of an internal reference voltage and a delay time of an internal clock signal in response to an MRS trim code or an electric fuse trim code, and that may generate a first buffered input signal; a column gate that may gate the first buffered input signal in response to a decoded column address signal; and a sense amplifier that may amplify an output signal of the memory cell array to output to the column gate, and that may receive an output signal of the column gate to output to the memory cell array. The non-volatile semiconductor memory device may properly buffer an input signal of a small swing range.

28 Claims, 11 Drawing Sheets

U.S. PATENT DOCUMENTS

| | | | |
|---|---|---|---|
| 6,965,964 B2 * | 11/2005 | Lee et al. | 711/103 |
| 2003/0135690 A1 * | 7/2003 | Lee et al. | 711/103 |
| 2004/0037140 A1 * | 2/2004 | Kang | 365/205 |
| 2006/0044874 A1 * | 3/2006 | Tokiwa | 365/185.21 |
| 2006/0221727 A1 * | 10/2006 | Yamashita et al. | 365/194 |
| 2007/0069779 A1 * | 3/2007 | Kim | 327/158 |
| 2007/0283196 A1 * | 12/2007 | Park | 714/718 |

FOREIGN PATENT DOCUMENTS

| | | |
|---|---|---|
| KR | 1020020007784 A | 1/2002 |

\* cited by examiner

INPUT CIRCUIT OF A NON-VOLATILE SEMICONDUCTOR MEMORY DEVICE

PRIORITY STATEMENT

This application claims priority under 35 USC §119 to Korean Patent Application No. 2006-0112981, filed on Nov. 15, 2006, in the Korean Intellectual Property Office (KIPO), the entire contents of which are incorporated herein by reference.

BACKGROUND

1. Field

The example embodiments relate to a semiconductor memory device, and more particularly to an input circuit of a non-volatile semiconductor memory device, and a method of inputting data into a non-volatile semiconductor memory device.

2. Description of Related Art

A conventional non-volatile semiconductor memory device may use a low voltage complementary metal oxide semiconductor (LVCMOS) interface which may include a NOR gate, a NAND gate, or the like because a write-speed of the conventional non-volatile semiconductor memory device, for example, a flash memory device, may be relatively slow.

FIG. 1 is a circuit diagram illustrating an example of the input circuit of a conventional non-volatile semiconductor memory device.

Referring to FIG. 1, the input circuit may include an input buffer 10, a clock buffer 20, and a sampler 30. The input buffer 10 may include a NOR gate 11 and inverters 13, 15, and 17. The clock buffer 20 may include a NOR gate 21 and inverters 23, 25, and 27. The sampler 30 may include a D flip-flop 31 and inverters 33 and 35. The input buffer 10 may buffer an input signal IN in response to an enable signal EN. The clock buffer 20 may buffer a clock signal CLK in response to a clock enable signal CLK_EN. The sampler 30 may sample an output signal of the input buffer 10 in response to an output signal of the clock buffer 20, and may generate a buffer output signal BOUT.

The conventional non-volatile semiconductor memory device may convert the input signal to a complementary metal oxide semiconductor (CMOS) signal that may be used in an internal circuit by using LVCMOS interface circuit like, for example, the circuit illustrated in FIG. 1 because a write-speed of the conventional non-volatile semiconductor memory device may be relatively slow.

As speeds for transmitting an input signal on a system bus become faster, swing ranges and setup/hold margins of the input signal may become smaller. Accordingly the input signal may be buffered improperly in a conventional input circuit. Thus an input circuit that can buffer the input signal of a small swing range may be required.

SUMMARY

Accordingly, the example embodiments provided may substantially address one or more of the problems that exist due to limitations and disadvantages of the related art.

At least one example embodiment provides a non-volatile semiconductor memory device that may include an input circuit capable of trimming a reference voltage and/or a clock signal and properly buffering an input signal of a small swing range.

At least one example embodiment provides a method of inputting data into a non-volatile semiconductor memory device that may be capable of trimming a reference voltage and/or a clock signal, and properly buffering an input signal of a small swing range.

A non-volatile semiconductor memory device according at least one example embodiment may include a memory cell array that may include a plurality of memory transistors; an input circuit that may control a voltage level of an internal reference voltage and a delay time of an internal clock signal in response to a Mode Register Set (MRS) trim code or an electric fuse trim code, and may generate a first buffered input signal; a column gate that may gate the first buffered input signal in response to a decoded column address signal; and a sense amplifier that may amplify an output signal of the memory cell array to output to the column gate, and that may receive an output signal of the column gate to output to the memory cell array.

The input circuit according to at least one example embodiment may include a reference voltage generating circuit that may generate the internal reference voltage in response to a first MRS trim code or a first electric fuse trim code; an internal clock signal generating circuit that may generate the internal clock signal in response to a second MRS trim code or a second electric fuse trim code; an input buffer that may buffer an input signal in response to the internal reference voltage, and may generate a second buffered input signal; and a sampler that may sample the second buffered input signal in response to the internal clock signal, and may generate the first buffered input signal.

The input buffer may be turned off in response to an enable signal.

The input buffer may include a differential amplifier that may amplify a difference between the input signal and the internal reference voltage to generate an amplified differential signal, and a buffer that may buffer the amplified differential signal.

The differential amplifier according to at least one example embodiment may include a first PMOS transistor that may have a source that is connected to a power voltage, a gate that is connected to a first node, and a drain that is connected to the first node; a second PMOS transistor that may have a source that is connected to the power voltage, a gate that is connected to the first node, and a drain that is connected to a second node; a first NMOS transistor that may have a gate that receives the input signal, a drain that is connected to the first node, and a source that is connected to a third node; a second NMOS transistor that may have a gate that receives the internal reference voltage, a drain that is connected to the second node, and a source that is connected to the third node; a third NMOS transistor that may have a gate that is connected to the first node, a drain that is connected to the third node; and a fourth NMOS transistor that may have a gate that receives the enable signal, a drain that is connected to the source of the third NMOS transistor, and a source that is connected to a ground voltage.

The buffer may include inverters of an even number.

The sampler may include a D flip-flop that may latch the second buffered input signal in response to the internal clock signal, and a buffer that may buffer an output signal of the D flip-flop.

The reference voltage generating circuit, according to at least one example embodiment, may include a multiplexer that may select one between the first MRS trim code and the first electric fuse trim code in response to a first trim control signal to output a first trim code; and a reference voltage generator that may generate the internal reference voltage, where the voltage level of the internal reference voltage may be changed in response to the first trim code.

The internal clock signal generating circuit, according to at least one example embodiment, may include a delay line that may delay an external clock signal, and may generate a plurality of delay clock signals; a first multiplexer that may select one between the second MRS trim code and the second electric fuse trim code in response to a second trim control signal to output a second trim code; and a second multiplexer that may select one of the plurality of delay clock signals in response to the second trim code to generate the internal clock signal.

The delay line may include unit delay cells which may have a cascade-connected structure, and the unit delay cells may delay a cell input signal for unit delay time period.

The delay line may include a first unit delay cell that may delay the external clock signal for the unit delay time period to generate a first delay clock signal; a second unit delay cell that may delay the first delay clock signal for the unit delay time period to generate a second delay clock signal; a third unit delay cell that may delay the second delay clock signal for the unit delay time period to generate a third delay clock signal, and a fourth unit delay cell that may delay the third delay clock signal for the unit delay time period to generate a fourth delay clock signal.

According to at least one example embodiment, the input circuit may include a reference voltage generating circuit that may generate the internal reference voltage in response to a first MRS trim code, a first electric fuse trim code, and an external reference voltage; an internal clock signal generating circuit that may generate an internal clock signal in response to a second MRS trim code or a second electric fuse trim code; an input buffer that may buffer an input signal in response to the internal reference voltage, and may generate a second buffered input signal; and a sampler that may sample the second buffered input signal in response to the internal clock signal, and may generate the first buffered input signal.

The input buffer may be turned off in response to an enable signal.

The sampler may include a D flip-flop that latches the second buffered input signal in response to the internal clock signal, and a buffer that may buffer an output signal of the D flip-flop.

According to at least one example embodiment, the reference voltage generating circuit may include a first multiplexer that may select one between the first MRS trim code and the first electric fuse trim code in response to a first trim control signal to output a first trim code; a reference voltage generator that may generate a first reference voltage, the voltage level of which may be changed in response to the first trim code; and a second multiplexer that may select between the external reference voltage and the first reference voltage in response to a reference voltage selection signal, and may generate the internal reference voltage.

According to at least one example embodiment, the internal clock signal generating circuit may include a delay line that may delay an external clock signal, and may generate a plurality of delay clock signals; a first multiplexer that may select one between the second MRS trim code and the second electric fuse trim code in response to a second trim control signal to output a second trim code; and a second multiplexer that may select one among the delay clock signals in response to the second trim code to generate the internal clock signal.

The input circuit may include an internal clock signal generating circuit that may generate the internal clock signal in response to an MRS trim code or an electric fuse trim code; an input buffer that may buffer an input signal, and may generate a second buffered input signal; and a sampler that may sample the second buffered input signal in response to the internal clock signal, and may generate the first buffered input signal.

The input buffer may be turned off in response to an enable signal.

The input buffer may include a NOR gate that may perform a logical NOR operation between the input signal and the enable signal, and a buffer that may buffer an output signal of the NOR gate.

According to at least one example embodiment, the internal clock signal generating circuit may include a delay line that may delay an external clock signal, and may generate a plurality of delay clock signals; a first multiplexer that may select one between the MRS trim code and the electric fuse trim code in response to a trim control signal to output a trim code, and a second multiplexer that may select one among the delay clock signals in response to the trim code to generate the internal clock signal.

According to at least one example embodiment, the input circuit may include a reference voltage generating circuit that may generate the internal reference voltage in response to an MRS trim code or an electric fuse trim code; an input buffer that may buffer an input signal in response to the internal reference voltage, and may generate a second buffered input signal; and a sampler that may sample the second buffered input signal in response to a clock signal, and may generate the first buffered input signal.

The input buffer may be turned off in response to an enable signal.

The reference voltage generating circuit, according to at least one example embodiment, may include a multiplexer that may select one between the first MRS trim code and the first electric fuse trim code in response to a first trim control signal to output a first trim code; and a reference voltage generator that may generate the internal reference voltage, the voltage level of which may be changed in response to the first trim code.

The input circuit may further include a trim code generating circuit that may generate the first MRS trim code and the first electric fuse trim code.

The trim code generating circuit, according to at least one example embodiment, may include a decoder that may decode an MRS trim update signal; a first register that may store an MRS trim code, and may output the MRS trim code in response to an MRS trim enable signal; a second register that may store the MRS trim code, and may output the MRS trim code in response to the MRS trim update signal; a wordline driving circuit that may provide the MRS trim code to a non-volatile memory cell in response to the MRS trim update signal; a sense amplifier that may amplify a first voltage signal corresponding to the MRS trim code of the non-volatile memory cell, and may generate a first data; and a third register that may store the first data, and may generate an electric fuse trim code.

The trim code generating circuit may further include an MRS logic circuit that may generate the MRS trim enable signal, the MRS trim update signal, and the MRS trim code in response to command signals.

The input circuit may further include a trim code generating circuit that may generate the second MRS trim code and the second electric fuse trim code.

In a method of inputting data into a non-volatile semiconductor memory device according to at least one example embodiment, an internal reference voltage may be generated in response to a first MRS trim code or a first electric fuse trim code; an internal clock signal may be generated in response to a second MRS trim code or a second electric fuse trim code; an input signal may be buffered for a second buffered input signal to be generated in response to the internal reference voltage; and the second buffered input signal may be sampled for a first buffered input signal to be generated in response to the internal clock signal.

In generating the internal reference voltage according to at least one example embodiment, the internal reference voltage may be trimmed; the input signal may be received; it may be determined whether a received input signal is correct; trimming the internal reference voltage, receiving the input signal, and determining whether a received input signal is correct may be repeated when a received input signal is incorrect; a final trim code may be stored in a register when a received input signal is correct; and the final trim code may be written into a non-volatile semiconductor memory cell.

In generating the internal clock signal, the internal clock signal may be trimmed; the input signal may be received; it may be determined whether a received input signal is correct; trimming the internal clock signal, receiving the input signal, and determining whether a received input signal is correct may be repeated when the received input signal is incorrect; a final trim code may be stored in a register when the received input signal is correct; and the final trim code may be written into a non-volatile semiconductor memory cell.

Accordingly, the non-volatile semiconductor memory device may buffer an input signal of a small swing range properly, and an input signal of a small range may be buffered properly by the method of inputting data into a non-volatile semiconductor memory device.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
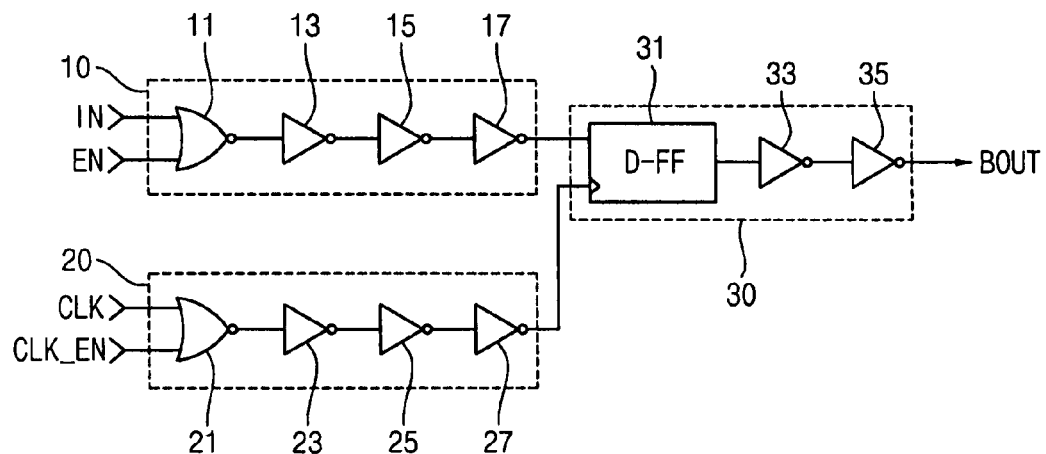
FIG. 1 is a circuit diagram illustrating an input circuit of a conventional non-volatile semiconductor memory device.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the related art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
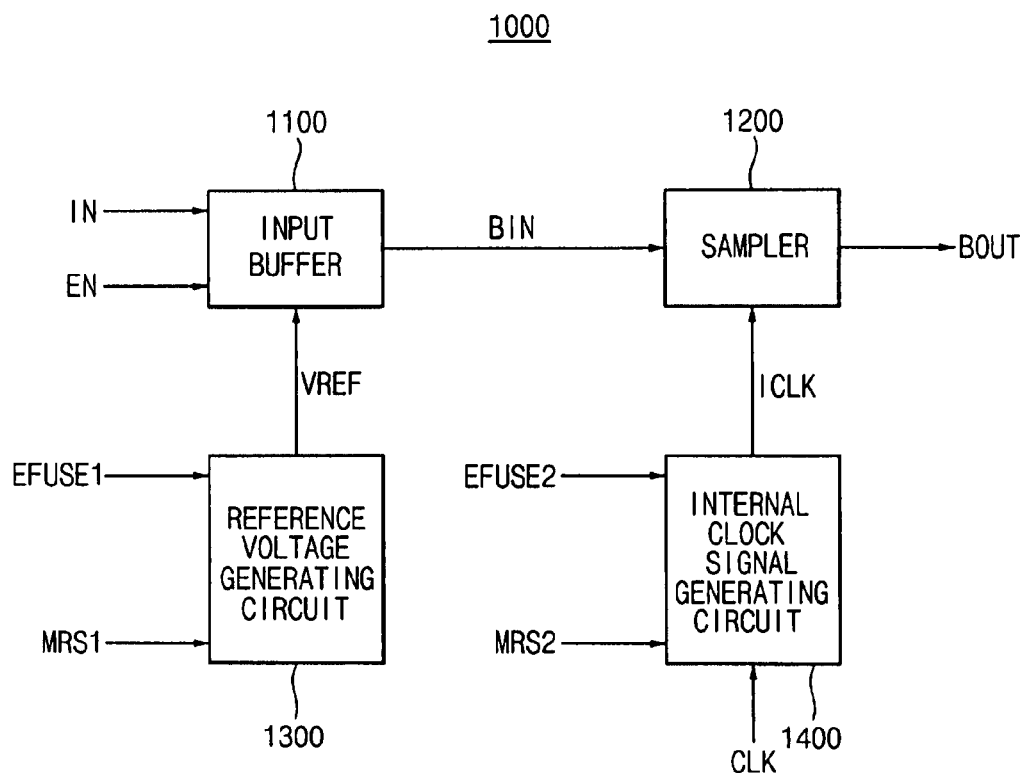
FIG. 2 is a block diagram illustrating an input circuit of a non-volatile semiconductor memory device according to at least one example embodiment.

FIG. 2 is a block diagram illustrating an input circuit of a non-volatile semiconductor memory device according to at least one example embodiment.

Referring to FIG. 2, the input circuit 1000 may include a reference voltage generating circuit 1300, an internal clock signal generating circuit 1400, an input buffer 1100, and a sampler 1200.

The reference voltage generating circuit 1300 may generate an internal reference voltage VREF in response to a first Mode Register Set (MRS) trim code MRS1 or a first electric fuse trim code EFUSE1. The internal clock signal generating circuit 1400 may generate an internal clock signal ICLK in response to a second MRS trim code MRS2 or a second electric fuse trim code EFUSE2. The input buffer 1100 may buffer an input signal IN in response to the internal reference voltage VREF and an enable signal EN, and may generate a first buffered input signal BIN. The sampler 1200 may sample the first buffered input signal BIN in response to the internal clock signal ICLK, and may generate a second buffered input signal BOUT.

Figure 3:
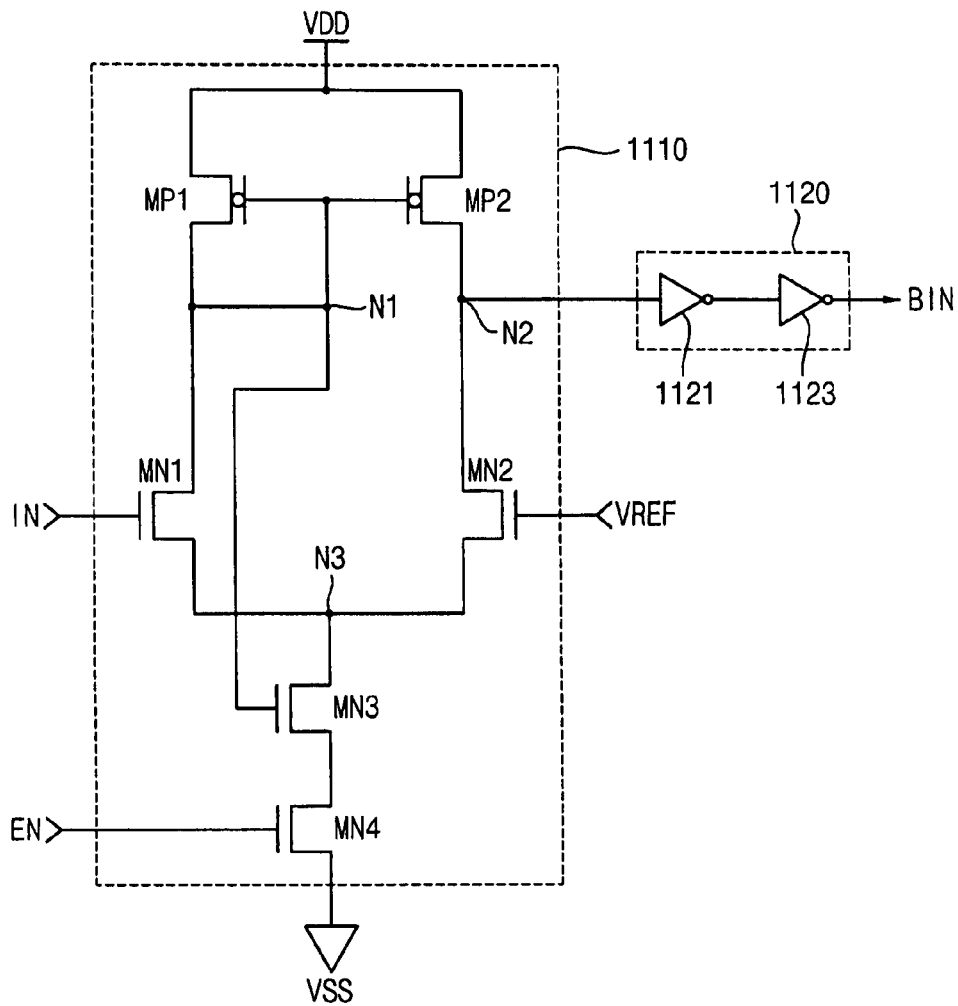
FIG. 3 is a circuit diagram illustrating an input buffer in the input circuit of FIG. 2 according to at least one example embodiment.

FIG. 3 is a circuit diagram illustrating an input buffer in the input circuit of FIG. 2 according to at least one example embodiment.

Referring to FIG. 3, the input buffer 1100 may include a differential amplifier 1110 and buffer 1120. The differential amplifier 1110 may amplify a difference between an input signal IN and an internal reference voltage VREF, and may generate an amplified differential signal. The buffer 1120 may buffer the amplified differential signal, and may generate a first buffered input signal BIN.

The differential amplifier 1110 may include a first PMOS transistor MP1, a second PMOS transistor MP2, a first NMOS transistor MN1, a second NMOS transistor MN2, a third NMOS transistor MN3, and a fourth NMOS transistor MN4.

The first PMOS transistor MP1 may have a source that is connected to a power voltage VDD, a gate that is connected to a first node N1, and a drain that is connected to the first node N1. The second PMOS transistor MP2 may have a source that is connected to the power voltage VDD, a gate that is connected to the first node N1, and a drain that is connected to a second node N2. The first NMOS transistor MN1 may have a gate that receives an input signal IN, a drain that is connected to the first node N1, and a source that is connected to a third node N3. The second NMOS transistor MN2 may have a gate that receives an internal reference voltage VREF, a drain that is connected to the second node N2, and a source that is connected to the third node N3. The third NMOS transistor MN3 may have a gate that is connected to the first node N1 and a drain that is connected to the third node N3. The fourth NMOS transistor MN4 may have a gate that receives an enable signal EN, a drain that is connected to the source of the third NMOS transistor MN3, and a source that is connected to a ground voltage VSS.

The buffer 1120 may include, for example, a first inverter 1121 and a second inverter 1123.

Figure 4:
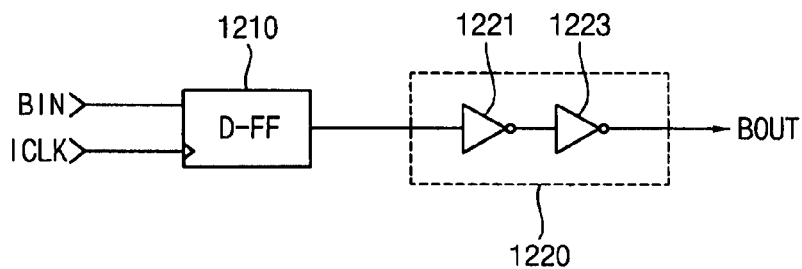
FIG. 4 is a circuit diagram illustrating a sampler in the input circuit of FIG. 2 according to at least one example embodiment.

FIG. 4 is a circuit diagram illustrating a sampler in the input circuit of FIG. 2, according to at least one example embodiment.

Referring to FIG. 4, the sampler 1200 may include a D flip-flop 1210 and a buffer 1220. The D flip-flop 1210 may latch a first buffered input signal BIN in response to an internal clock signal ICLK. The buffer 1220 may include inverters 1221 and 1223 and may buffer an output signal of the D flip-flop 1210. Although FIG. 4 illustrates that the buffer 1220 includes two inverters 1221 and 1223, the buffer 1220 may include more inverters of an even number.

Figure 5:
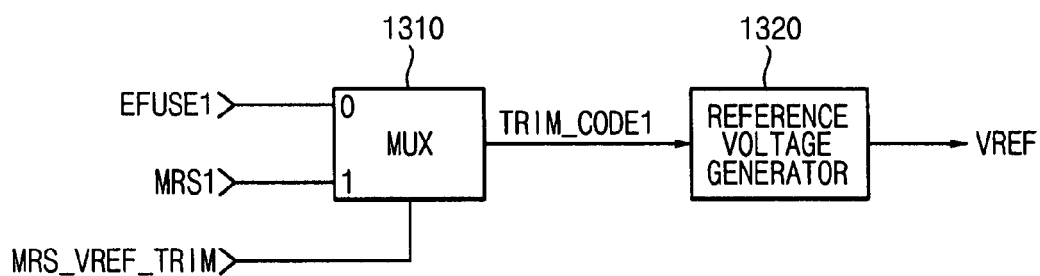
FIG. 5 is a circuit diagram illustrating a reference voltage generating circuit in the input circuit of FIG. 2 according to at least one example embodiment.

FIG. 5 is a circuit diagram illustrating a reference voltage generating circuit in the input circuit of FIG. 2, according to at least one example embodiment.

Referring to FIG. 5, the reference voltage generating circuit 1300 may include a multiplexer 1310 and a reference voltage generator 1320. The multiplexer 1310 may select one between a first MRS trim code MRS1 and a first electric fuse trim code EFUSE1 in response to a first trim control signal MRS_VREF_TRIM, and may output a first trim code TRIM_CODE1. The reference voltage generator 1320 may generate an internal reference voltage VREF such that a voltage level of the internal reference voltage VREF is changed in response to the first trim code TRIM_CODE1.

Figure 6:
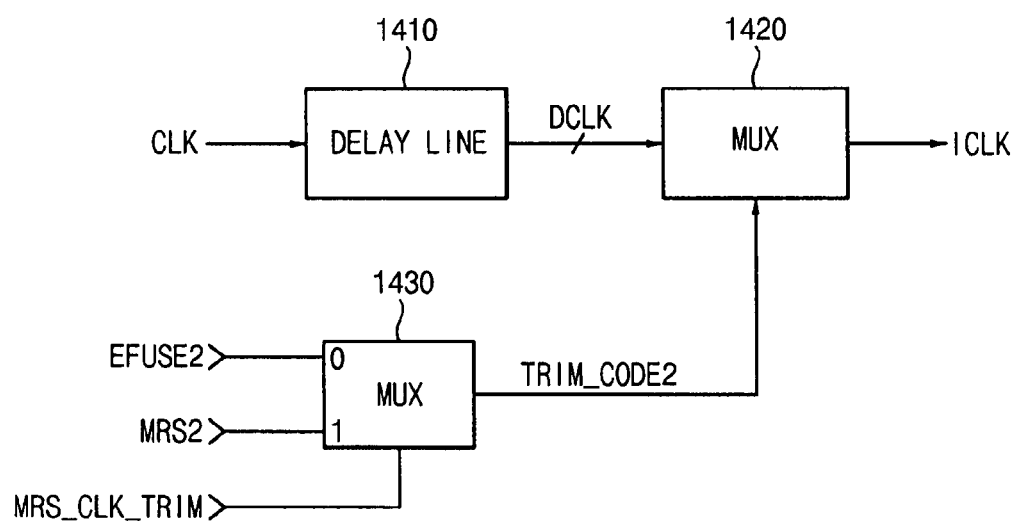
FIG. 6 is a circuit diagram illustrating an internal clock signal generating circuit in the input circuit of FIG. 2 according to at least one example embodiment.

FIG. 6 is a circuit diagram illustrating an internal clock signal generating circuit in the input circuit of FIG. 2, according to at least one example embodiment.

Referring to FIG. 6, the internal clock signal generating circuit 1400 may include a delay line 1410, a first multiplexer 1430, and a second multiplexer 1420.

The delay line 1410 may delay an external clock signal CLK, and may generate delay clock signals DCLK. The first multiplexer 1430 may select one between a second MRS trim code MRS2 and a second electric fuse trim code EFUSE2 in response to a second trim control signal MRS_CLK_TRIM, and may output a second trim code TRIM_CODE2. The second multiplexer 1420 may select one among the delay clock signals DCLK in response to the second trim code TRIM_CODE2, and may generate an internal clock signal ICLK.

Figure 7:
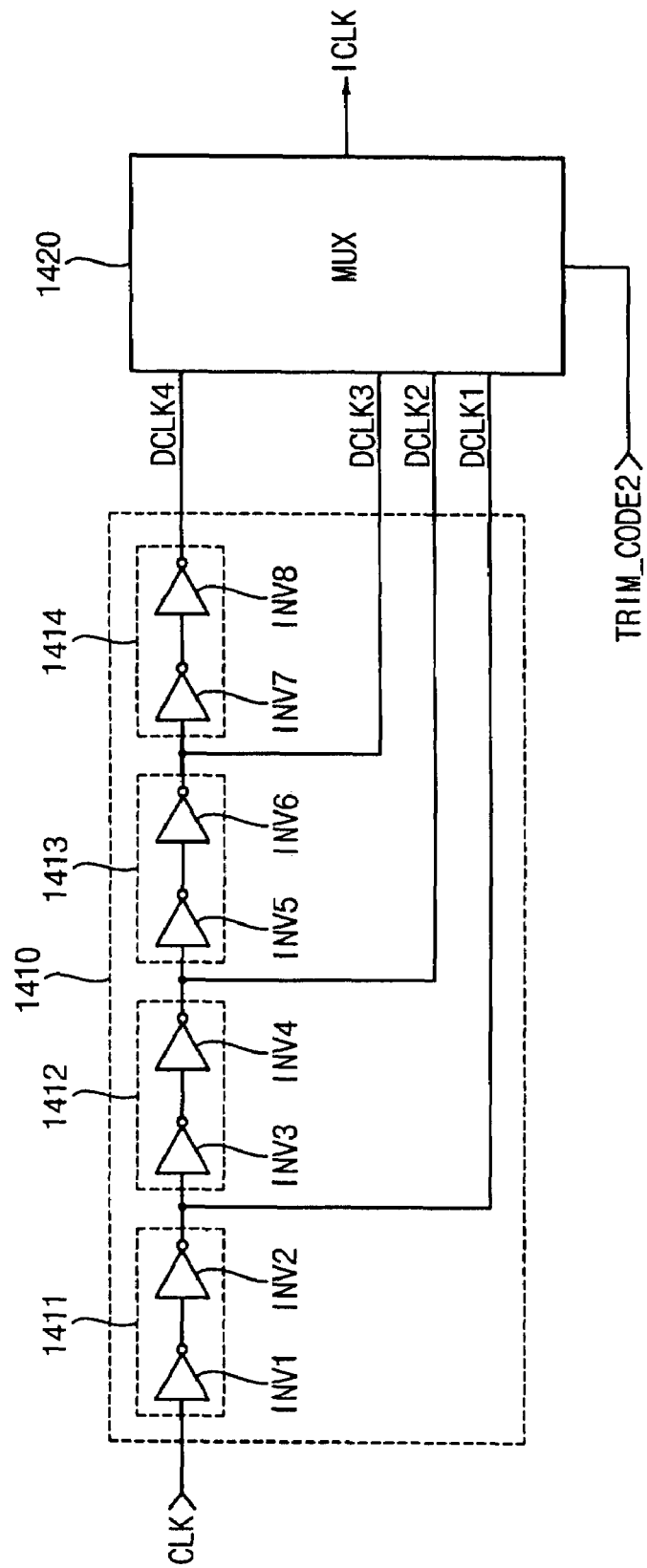
FIG. 7 is a circuit diagram illustrating a delay line and a multiplexer in the internal clock signal generating circuit of FIG. 6 according to at least one example embodiment.

FIG. 7 is a circuit diagram illustrating a delay line and a multiplexer in the internal clock signal generating circuit of FIG. 6, according to at least one example embodiment.

Referring to FIG. 7, the delay line 1410 may have a cascade-connected structure, in which unit delay cells may delay a cell input signal for a unit delay time period. The delay line 1410 may include a first unit delay cell 1411, a second unit delay cell 1412, and a third unit delay cell 1413, and a fourth unit delay cell 1414.

The first unit delay cell 1411 may delay an external clock signal CLK for the unit delay time period, and may generate a first delay clock signal DCLK1. The second unit delay cell 1412 may delay the first delay clock signal DCLK1 for the unit delay time period, and may generate a second delay clock signal DCLK2. The third unit delay cell 1413 may delay the second delay clock signal DCLK2 for the unit delay time period, and may generate a third delay clock signal DCLK3. The fourth unit delay cell 1414 may delay the third delay clock signal DCLK3 for the unit delay time period, and may generate a fourth delay clock signal DCLK4.

The second multiplexer 1420 may select one among the first delay clock signal DCLK1, the second delay clock signal DCLK2, the third delay clock signal DCLK3, and the fourth delay clock signal DCLK4 in response to a second trim code TRIM_CODE2, and may generate an internal clock signal ICLK.

The input circuit 1000 in FIG. 2 may control a trimming range of an internal reference voltage VREF and a trimming range of a sampling clock. The input circuit 1000 may interface data in a high-speed semiconductor memory system.

Figure 8:
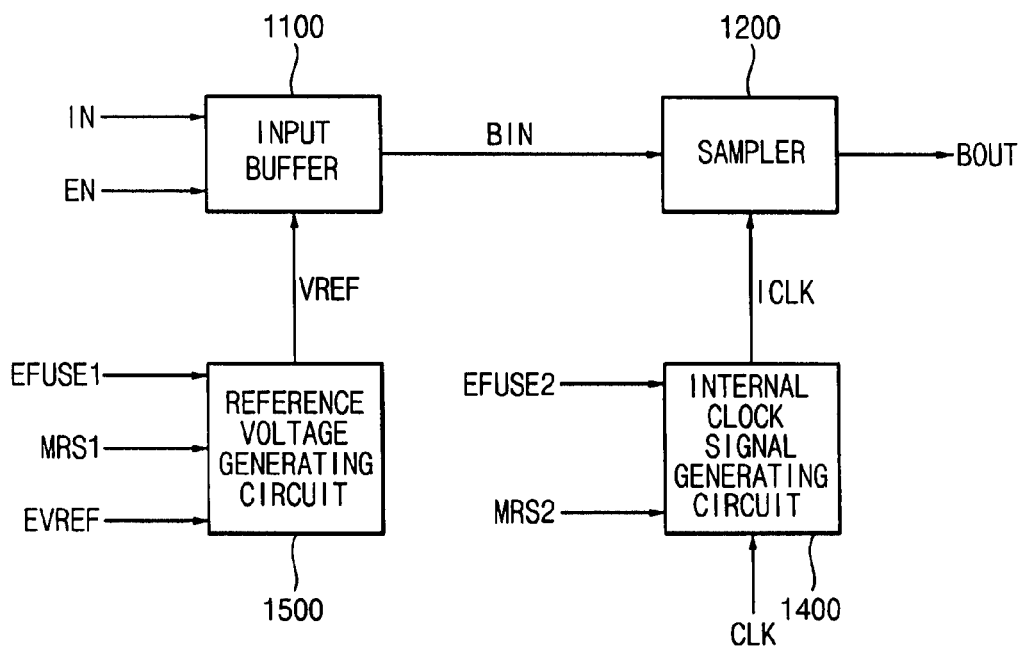
FIG. 8 is a block diagram illustrating an input circuit of a non-volatile semiconductor memory device according to at least one example embodiment.

FIG. 8 is a block diagram illustrating an input circuit of a non-volatile semiconductor memory device according to at least one example embodiment.

Referring to FIG. 8, the input circuit 2000 may include a reference voltage generating circuit 1500, an internal clock signal generating circuit 1400, an input buffer 1100, and a sampler 1200.

The reference voltage generating circuit 1500 may generate an internal reference voltage VREF in response to a first MRS trim code MRS1, a first electric fuse trim code EFUSE1, and an external reference voltage EVREF. The internal clock signal generating circuit 1400 may generate an internal clock signal ICLK in response to a second MRS trim code MRS2 and a second electric fuse trim code EFUSE2. The input buffer 1100 may buffer an input signal IN in response to the internal reference voltage VREF and an enable signal EN, and may generate a first buffered input signal BIN. The sampler 1200 may sample the first buffered input signal BIN in response to the internal clock signal ICLK, and may generate a second buffered input signal BOUT.

Figure 9:
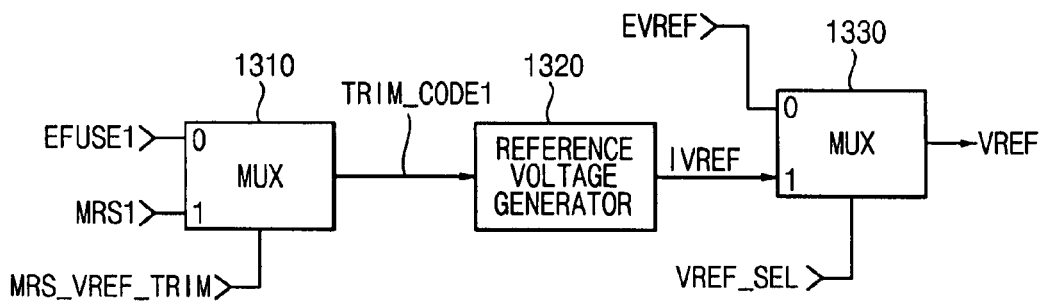
FIG. 9 is a circuit diagram illustrating a reference voltage generating circuit in the input circuit of FIG. 8 according to at least one example embodiment.

FIG. 9 is a circuit diagram illustrating a reference voltage generating circuit in the input circuit of FIG. 8 according to at least one example embodiment.

Referring to FIG. 9, the reference voltage generating circuit 1500 may include a first multiplexer 1310, a reference voltage generator 1320, and a second multiplexer 1330. The first multiplexer 1310 may select one between a first MRS trim code MRS1 and a first electric fuse trim code EFUSE1 in response to a first trim control signal MRS_VREF_TRIM, and may output a first trim code TRIM_CODE1. The reference voltage generator 1320 may generate an internal reference voltage VREF and a voltage level of a first reference voltage IVREF may be changed in response to the first trim code TRIM_CODE1. The second multiplexer 1330 may select one between an external reference voltage EVREF and the first reference voltage IVREF in response to a reference voltage selection signal VREF_SEL, and may generate an internal reference voltage VREF.

The internal clock signal generating circuit 1400, the input buffer 1100, and the sampler 1200 of the input circuit 2000 in FIG. 8 may have the same structure as the internal clock signal generating circuit 1400, the input buffer 1100, and the sampler 1200 of the input circuit 1000 in FIG. 2.

The input circuit 2000 in FIG. 8 may use an external reference voltage EVREF or, alternatively, a reference voltage which may be generated by the reference voltage generating circuit 1500.

Figure 10:
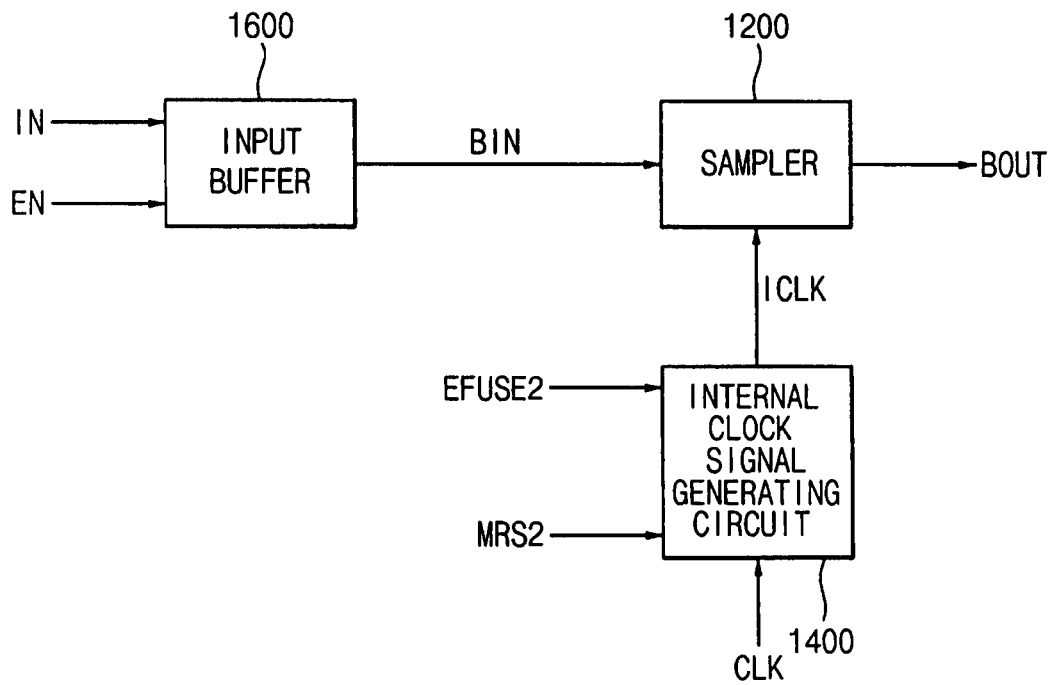
FIG. 10 is a block diagram illustrating an input circuit of a non-volatile semiconductor memory device according to at least one example embodiment.

FIG. 10 is a block diagram illustrating an input circuit of a non-volatile semiconductor memory device according to at least one example embodiment.

Referring to FIG. 10, the input circuit 3000 may include an internal clock signal generating circuit 1400, an input buffer 1600, and a sampler 1200.

The internal clock signal generating circuit 1400 may generate an internal clock signal ICLK in response to a second MRS trim code MRS2 and a second electric fuse trim code EFUSE2. The input buffer 1600 may be turned on or off in response to an enable signal EN, may buffer an input signal IN, and may generate a first buffered input signal BIN. The sampler 1200 may sample the first buffered input signal BIN in response to the internal clock signal ICLK, and may generate a second buffered input signal BOUT.

Figure 11:
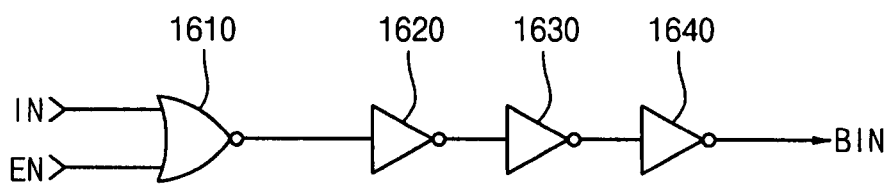
FIG. 11 is a circuit diagram illustrating an input buffer in the input circuit of FIG. 10 according to at least one example embodiment.

FIG. 11 is a circuit diagram illustrating an input buffer in the input circuit of FIG. 10 according to at least one example embodiment.

Referring to FIG. 11, the input buffer 1600 may include a NOR gate 1610 and a buffer that may include inverters 1620, 1630, and 1640. The NOR gate 1610 may perform a logical NOR operation upon an input signal IN and an enable signal EN. The buffer, including the inverters 1620, 1630, and 1640, may buffer an output signal of the NOR gate 1610.

The internal clock signal generating circuit 1400, the input buffer 1600, and the sampler 1200 of the input circuit 3000 in FIG. 10 may have the same structure as the internal clock signal generating circuit 1400, the input buffer 1100, and the sampler 1200 of the input circuit 1000 in FIG. 2.

The input circuit 3000 in FIG. 10 may include the internal clock signal generating circuit 1400, and may decide a trimming range by controlling a delay time of an internal clock signal ICLK without using the reference voltage generating circuit 1300 of FIG. 2. The input buffer 1600 of the input circuit 3000 in FIG. 10 may buffer an input signal IN without an internal reference voltage as illustrated in FIG. 11.

Figure 12:
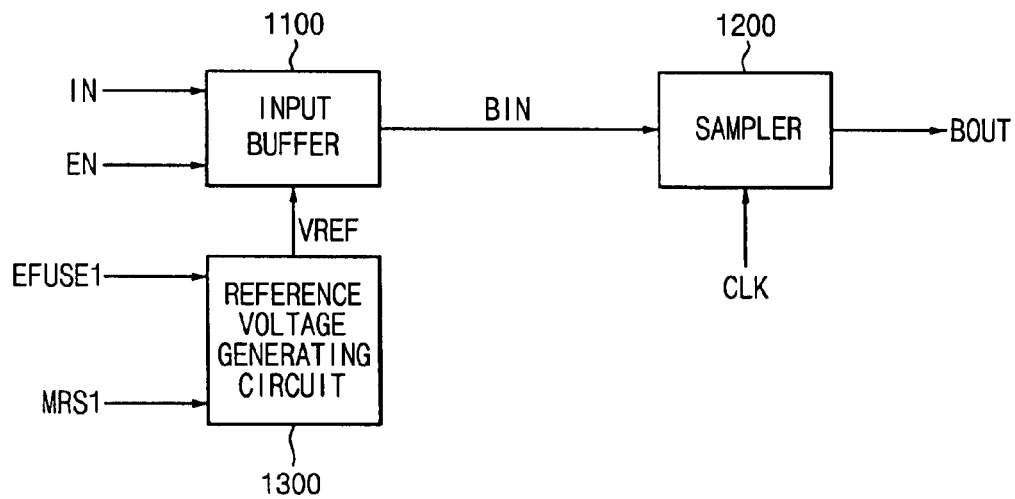
FIG. 12 is a block diagram illustrating an input circuit of a non-volatile semiconductor memory device according to at least one example embodiment.

FIG. 12 is a block diagram illustrating an input circuit of a non-volatile semiconductor memory device according to at least one example embodiment.

Referring to FIG. 12, the input circuit 4000 may include a reference voltage generating circuit 1300, an input buffer 1100, and a sampler 1200.

The reference voltage generating circuit 1300 may generate an internal reference voltage VREF in response to a first MRS trim code MRS1 and a first electric fuse trim code EFUSE1. The input buffer 1100 may buffer an input signal IN in response to the internal reference voltage VREF and an enable signal EN, and may generate a first buffered input signal BIN. The sampler 1200 may sample the first buffered input signal BIN in response to a clock signal CLK, and may generate a second buffered input signal BOUT. The clock signal CLK in FIG. 12 may be an external clock signal that is inputted from outside of a non-volatile semiconductor memory device.

The reference voltage generating circuit 1300, the input buffer 1100, and the sampler 1200 of the input circuit 4000 in FIG. 12 may have the same structure as the reference voltage generating circuit 1300, the input buffer 1100, and the sampler 1200 of the input circuit 1000 in FIG. 2.

The input circuit 4000 in FIG. 12 may include the reference voltage generating circuit 1500, and may decide a trimming range by controlling a delay time of an internal reference voltage VREF without using the internal clock signal generating circuit 1400 of FIG. 2.

Figure 13:
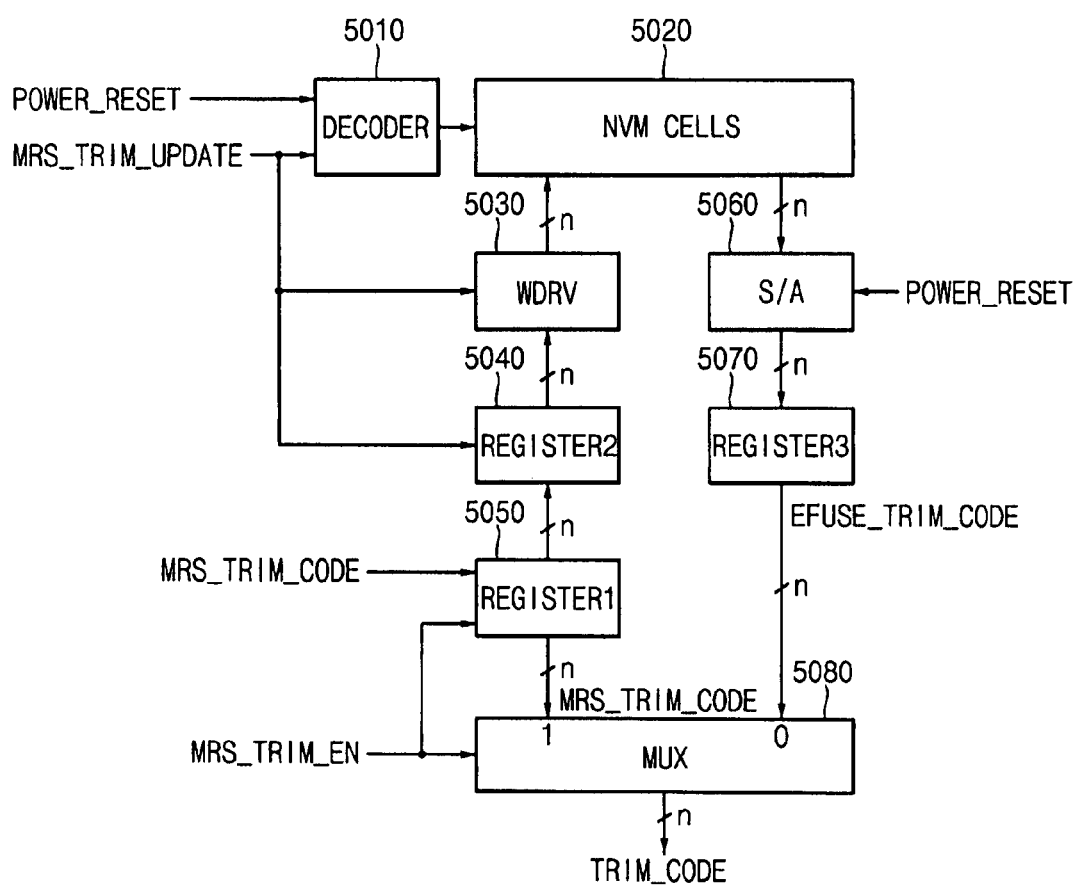
FIG. 13 is a block diagram illustrating a trim code generating circuit in the input circuit of the non-volatile semiconductor memory device according to at least one example embodiment.

FIG. 13 is a block diagram illustrating a trim code generating circuit in the input circuit of the non-volatile semiconductor memory device according to at least one example embodiment.

Referring to FIG. 13, the trim code generating circuit 5000 may include a decoder 5010, a first register 5050, a second register 5040, a word-line driving circuit 5030, a sense amplifier 5060, a third register 5070, a multiplexer 5080, and a non-volatile semiconductor memory cell 5020.

The decoder 5010 may decode an MRS trim update signal MRS_TRIM_UPDATE. The first register 5050 may store an MRS trim code MRS_TRIM_CODE, and may output the MRS trim code MRS_TRIM_CODE in response to an MRS trim enable signal MRS_TRIM_EN. The second register 5040 may store the MRS trim code MRS_TRIM_CODE, and may output the MRS trim code MRS_TRIM_CODE in response to the MRS trim update signal MRS_TRIM_UPDATE. The word-line driving circuit 5030 may provide the MRS trim code MRS_TRIM_CODE to the non-volatile semiconductor memory cell 5020 in response to the MRS trim update signal MRS_TRIM_UPDATE. The sense amplifier 5060 may amplify a first voltage signal corresponding to the MRS trim code MRS_TRIM_CODE of the non-volatile semiconductor memory cell 5020, and may generate a first data. The third register 5070 may store the first data, and may generate an electric fuse trim code EFUSE_TRIM_CODE. The multiplexer 5080 may select one between the MRS trim code MRS_TRIM_CODE and the electric fuse trim code EFUSE_TRIM_CODE in response to an MRS trim enable signal MRS_TRIM_EN, and may generate a trim code TRIM_CODE. The multiplexer 5080 in FIG. 13 may correspond to a multiplexer 1310 in FIG. 5, a multiplexer 1430 in FIG. 6, and a multiplexer 1310 in FIG. 9.

Figure 14:
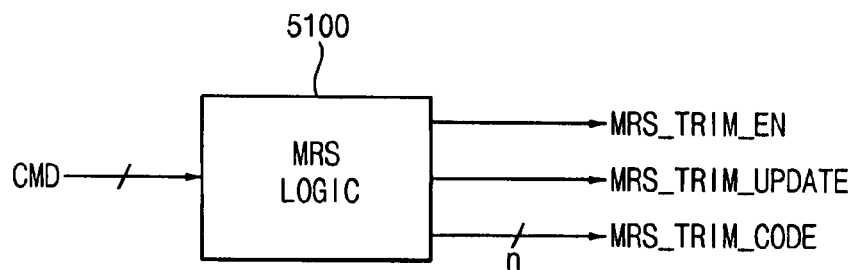
FIG. 14 is a block diagram illustrating an MRS logic circuit that generates MRS control signals in the trim code generating circuit of FIG. 13 according to at least one example embodiment.

FIG. 14 is a block diagram illustrating an MRS logic circuit that may generate MRS control signals in the trim code generating circuit of FIG. 13, according to at least one example embodiment.

Referring to FIG. 14, the MRS control signals may include an MRS trim enable signal MRS_TRIM_EN, an MRS trim update signal MRS_TRIM_UPDATE, and an MRS trim code MRS_TRIM_CODE. The MRS logic circuit 5100 may generate the MRS trim enable signal MRS_TRIM_EN, the MRS trim update signal MRS_TRIM_UPDATE, and the MRS trim code MRS_TRIM_CODE in response to command signals CMD.

Figure 15A:
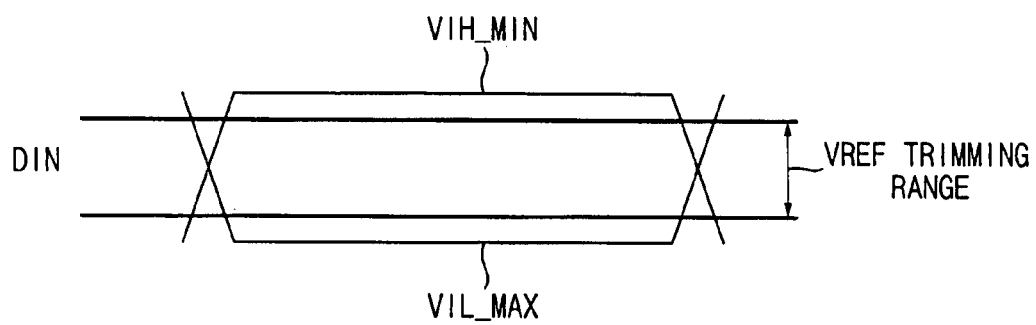
FIG. 15A is a diagram illustrating a trimming range of reference voltage with respect to an input signal.

FIG. 15A is a diagram illustrating a trimming range of a reference voltage with respect to an input signal.

Referring to FIG. 15A, the trimming range of the reference voltage VREF may have a value between a minimum value VIH_MIN of a high level of the input signal DIN and a maximum value VIL-MAX of a low level of the input signal DIN.

Figure 15B:
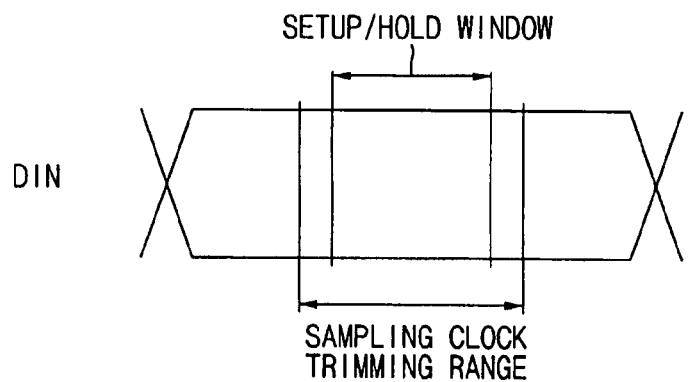
FIG. 15B is a diagram illustrating a trimming range of sampling clock with respect to an input signal.

FIG. 15B is a diagram illustrating a trimming range of a sampling clock with respect to an input signal.

Referring to FIG. 15B, the trimming range of the sampling clock may cover setup/hold window SETUP/HOLD WINDOW.

Figure 16A:
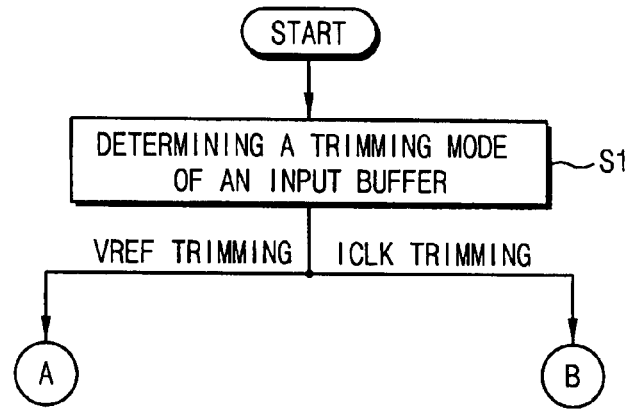
FIG. 16A, FIG. 16B, and FIG. 16C are a flow diagram illustrating a method of trimming a reference voltage and an internal clock signal according to at least one example embodiment.
Figure 16B:
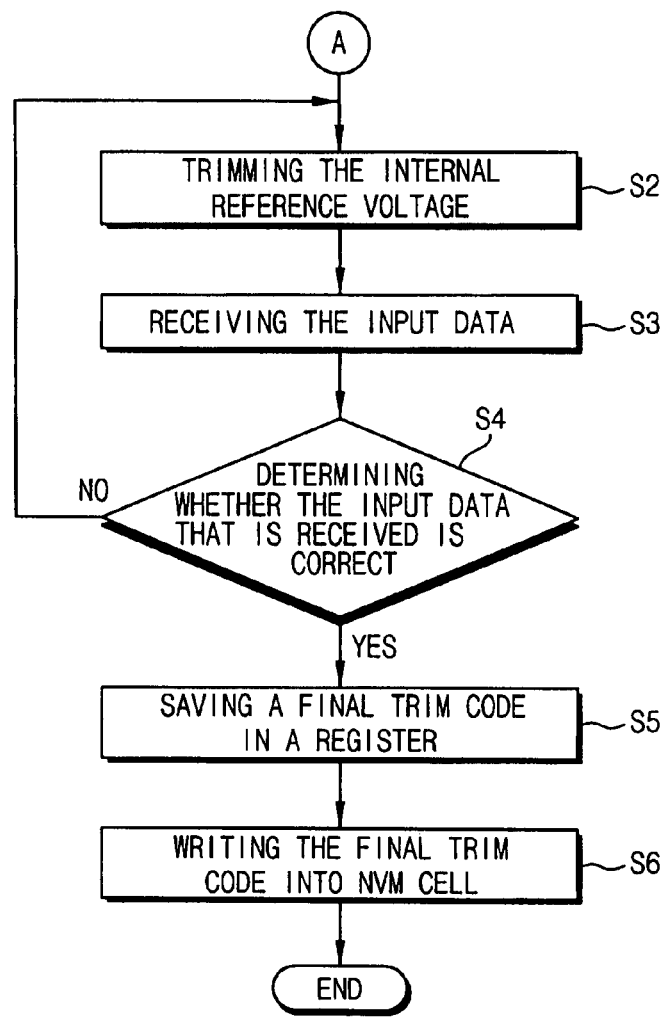
Figure 16C:
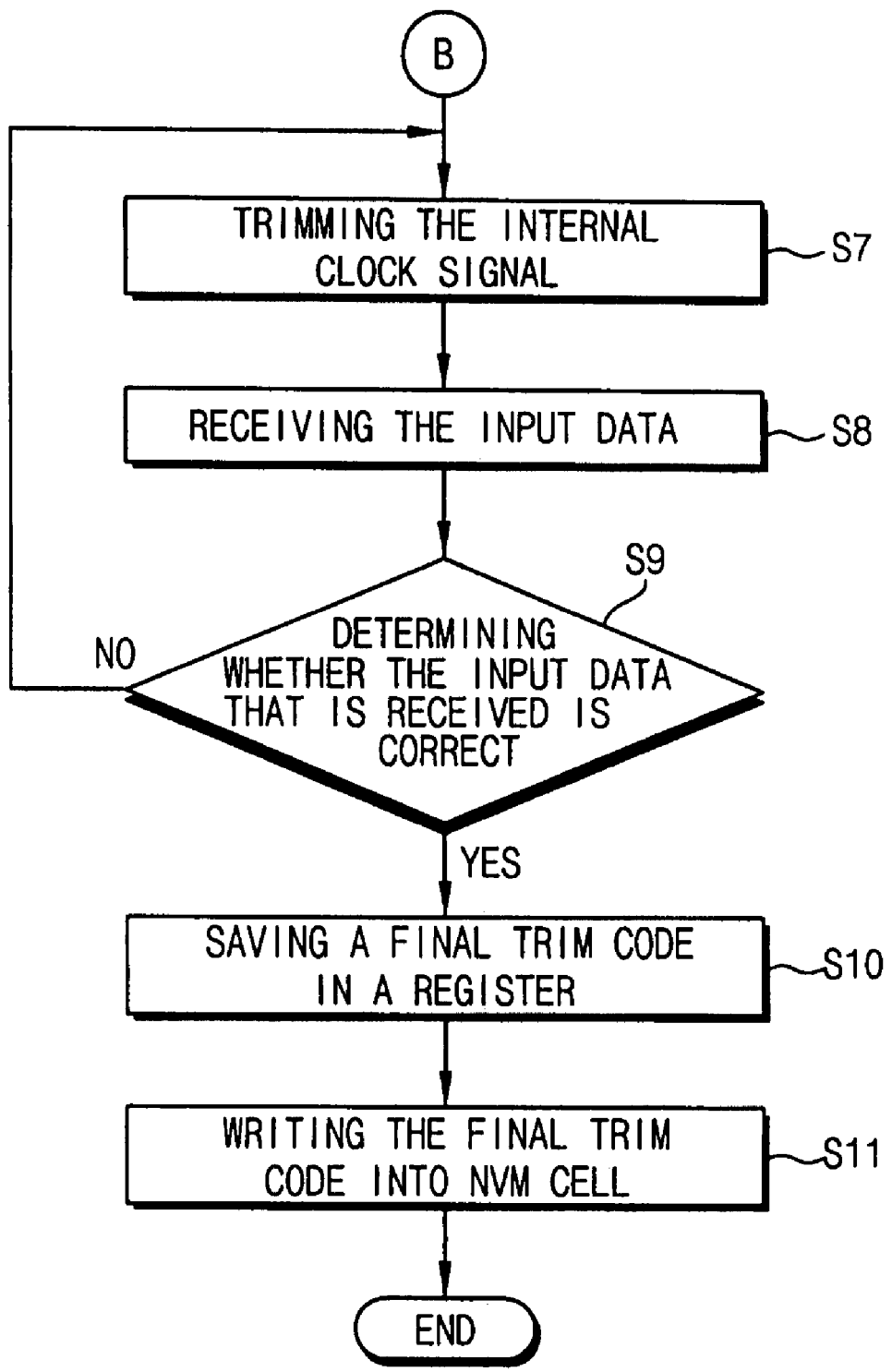

FIG. 16A, FIG. 16B, and FIG. 16C are a flow diagram illustrating a method of trimming a reference voltage and an internal clock signal, according to at least one example embodiment.

Referring to FIG. 16A, in a method of trimming the reference voltage and the internal clock signal, a trimming mode of an input buffer may be determined (S1). The method may be continued via "A" when the trimming mode of the input buffer corresponds to the internal reference voltage VREF trimming mode. The method may be continued via "B" when the trimming mode of the input buffer corresponds to the internal clock signal ICLK trimming mode.

Referring to FIG. 16B, in generating the internal reference voltage, the internal reference voltage may be trimmed (S2); an input data may be received (S3); it may be determined whether the input data that is received is correct (S4); S2, step, and S4 may be repeated when the input data that is received is incorrect; a final trim code may be stored in a register when the input data that is received is correct (S5); and the final trim code may be written into a non-volatile semiconductor memory cell (S6).

Referring to FIG. 16C, in generating the internal clock signal ICLK, the internal clock signal ICLK may be trimmed (S7); an input data may be received (S8); it may be determined whether the input data that is received is correct (S9); S7, S8, and S9 may be repeated when the input data that is received is incorrect; a final trim code may be stored in a register when the input data that is received is correct (S10); and the final trim code may be written into a non-volatile semiconductor memory cell (S11).

The input data in FIG. 16B and FIG. 16C may correspond to an input signal in FIG. 2 through FIG. 12.

Figure 17:
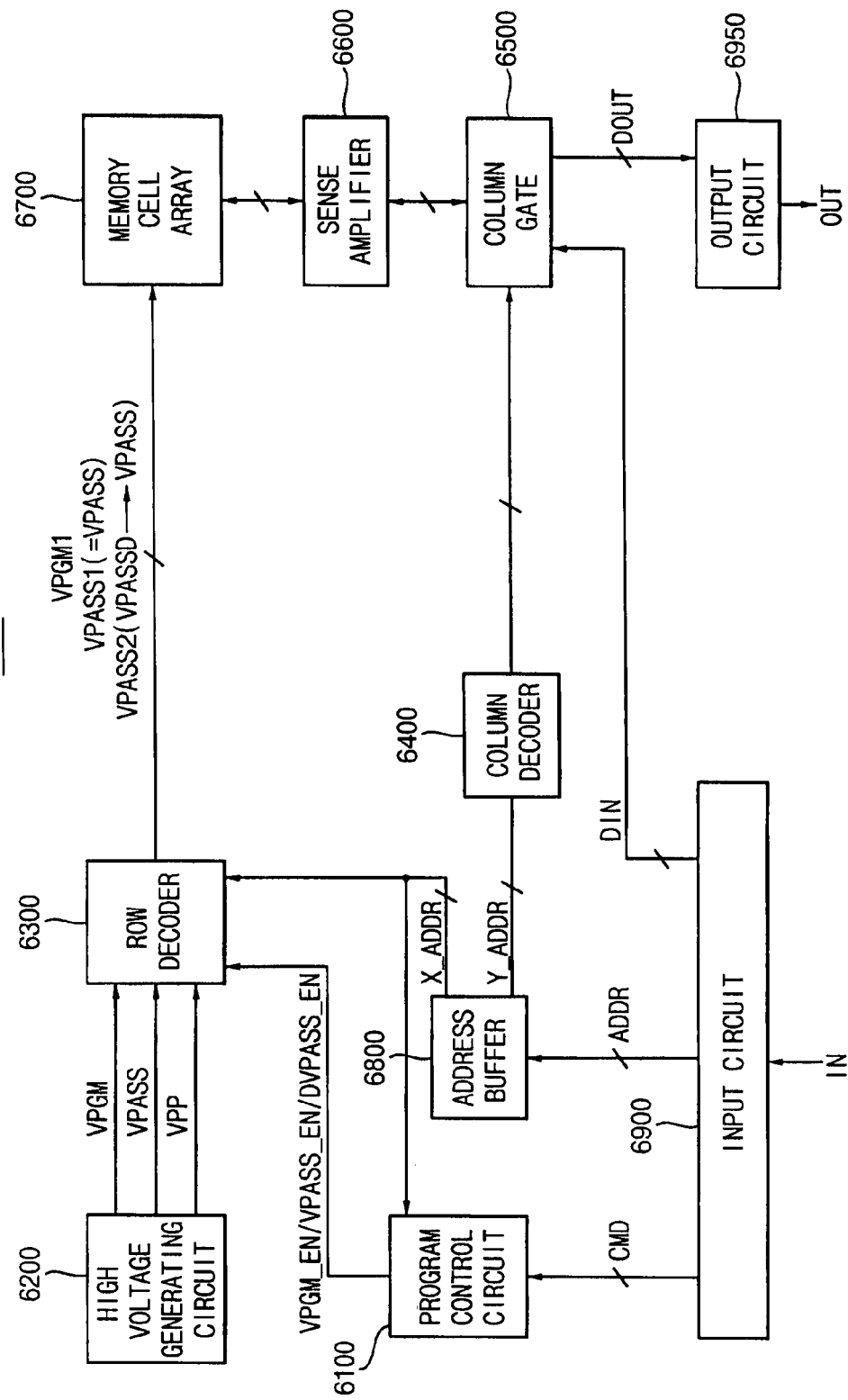
FIG. 17 is a block diagram illustrating a non-volatile semiconductor memory device that includes an input circuit according to at least one example embodiment.

FIG. 17 is a block diagram illustrating a non-volatile semiconductor memory device that includes an input circuit according to at least one example embodiment.

Referring to FIG. 17, the non-volatile semiconductor memory device 6000 may include a program control circuit 6100, a high voltage generating circuit 6200, a row decoder 6300, and a memory cell array 6700.

The memory cell array 6700 may include memory transistors. The high voltage generating circuit 6200 may generate a program voltage signal VPGM, a pass voltage signal VPASS, and a boost voltage VPP. The program control circuit 6100 may generate a program voltage enable signal VPGM_EN, a pass voltage enable signal VPASS_EN, and a down pass voltage enable signal DVPASS_EN in response to command signals CMD and row address signal X_ADDR. The row decoder 6300 may generate a first program voltage signal VPGM1, a first pass voltage signal VPASS1, and a second pass voltage signal VPASS2. A voltage level of the first pass voltage signal VPASS1 may be changed to a voltage level of the pass voltage signal VPASS in response to the pass voltage enable signal VPASS_EN. The second pass voltage signal VPASS2 may be a voltage level of a down pass voltage signal VPASSD before the program voltage enable signal VPGM_EN is activated. The second pass voltage signal VPASS2 may have a voltage level of the pass voltage signal VPASS after the program voltage enable signal VPGM_EN is activated. The first program voltage signal VPGM1, the first pass voltage signal VPASS1, and the second voltage signal VPASS2 may be provided to word-lines that may be connected to the memory cell array 6700.

The non-volatile semiconductor memory device 6000 may further include an address buffer 6800, a column decoder 6400, a column gate 6500, and a sense amplifier 6600.

The address buffer 6800 may buffer an address signal ADDR, and may generate a row address signal X_ADDR and a column address signal Y_ADDR. The column decoder 6400 may decode the column address signal Y_ADDR, and may generate a decoded column address signal. The column gate 6500 may gate a first data that is received from outside the non-volatile semiconductor memory device 6000 and a second data that is outputted from the non-volatile semiconductor memory device 6000 in response to the decoded column address signal. The sense amplifier 6600 may amplify an output data of the memory cell array 6700 to provide the amplified output data of the memory cell array 6700 to the column gate 6500, and may receive an output data of the column gate 6500 to provide the output data of the column gate 6500 to the memory cell array 6700.

The non-volatile semiconductor memory device 6000 may include an input circuit 6900. The input circuit 6900 may buffer an input signal IN that is received from outside; may generate a command signal CMD, an address signal ADDR, and data; and may provide the command signal CMD, the address signal ADDR, and the data to internal circuits. The non-volatile semiconductor memory device 6000 may further include an output circuit that may buffer data that is received from the internal circuit, and output the data to an external circuit.

The input circuit 6900 of the non-volatile semiconductor memory device 6000 in FIG. 17 may be implemented with one of the input circuits in FIG. 2, FIG. 8, FIG. 10, and FIG. 12.

In accordance with the example embodiments, an input circuit in a non-volatile semiconductor memory device may trim a reference voltage and/or a clock signal. The input circuit may buffer an input signal of a small swing range properly, may interface between an internal circuit and an external circuit of the non-volatile semiconductor memory device, and may reduce standby currents.

In accordance with the example embodiments, in a method of inputting data into a non-volatile semiconductor memory device, the reference voltage and/or the clock signal may be trimmed, the input signal of a small swing range may be buffered properly, and the standby currents may be reduced.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A non-volatile semiconductor memory device, comprising:
    a memory cell array including a plurality of memory transistors;
    an input circuit configured to control a voltage level of an internal reference voltage in response to a first Mode Register Set (MRS) trim code or a first electric fuse trim code and/or control a delay time of an internal clock signal in response to a second MRS trim code or a second electric fuse trim code, and configured to generate a first buffered input signal;
    a colunm gate configured to gate the first buffered input signal in response to a decoded column address signal; and
    a sense amplifier configured to amplify an output signal of the memory cell array to output to the column gate, and configured to receive an output signal of the column gate to output to the memory cell array,
    wherein the input circuit includes
    an input buffer configured to buffer an input signal in response to the internal reference voltage, and configured to generate a second buffered input signal;
    a sampler configured to sample the second buffered input signal in response to the internal clock signal, and configured to generate the first buffered input signal;
    a reference voltage generating circuit configured to generate the internal reference voltage in response to the first MRS trim code or the first electric fuse trim code; and
    a first trim code generating circuit configured to generate the first MRS trim code and the first electric fuse trim code.

2. The non-volatile semiconductor memory device of claim 1, wherein the input circuit further includes:
    an internal clock signal generating circuit configured to generate the internal clock signal in response to the second MRS trim code or the second electric fuse trim code.

3. The non-volatile semiconductor memory device of claim 2, wherein the input buffer is turned off in response to an enable signal.

4. The non-volatile semiconductor memory device of claim 3, wherein the input buffer further includes:
    a differential amplifier configured to amplify a difference between the input signal and the internal reference voltage to generate an amplified differential signal; and
    a buffer configured to buffer the amplified differential signal.

5. The non-volatile semiconductor memory device of claim 4, wherein the differential amplifier includes:
    a first PMOS transistor having a source that is connected to a power voltage, a gate that is connected to a first node, and a drain that is connected to the first node;
    a second PMOS transistor having a source that is connected to the power voltage, a gate that is connected to the first node, and a drain that is connected to a second node;
    a first NMOS transistor having a gate that receives the input signal, a drain that is connected to the first node, and a source that is connected to a third node;
    a second NMOS transistor having a gate that receives the internal reference voltage, a drain that is connected to the second node, and a source that is connected to the third node;
    a third NMOS transistor having a gate that is connected to the first node, a drain that is connected to the third node; and
    a fourth NMOS transistor having a gate that receives the enable signal, a drain that is connected to the source of the third NMOS transistor, and a source that is connected to a ground voltage.

6. The non-volatile semiconductor memory device of claim 4, wherein the buffer includes inverters of an even number.

7. The non-volatile semiconductor memory device of claim 3, wherein the input buffer includes:
    a NOR gate configured to perform a logical NOR operation between the input signal and the enable signal; and
    a buffer configured to buffer an output signal of the NOR gate.

8. The non-volatile semiconductor memory device of claim 3, wherein the internal clock signal generating circuit includes:
    a delay line configured to delay an external clock signal, and configured to generate a plurality of delay clock signals;
    a first multiplexer configured to select one between the second MRS trim code and the second electric fuse trim code in response to a trim control signal to output a trim code; and
    a second multiplexer configured to select one among the delay clock signals in response to the trim code to generate the internal clock signal.

9. The non-volatile semiconductor memory device of claim 2, wherein the sampler includes:
    a D flip-flop configured to latch the second buffered input signal in response to the internal clock signal; and a buffer configured to buffer an output signal of the D flip-flop.

10. The non-volatile semiconductor memory device of claim 2, wherein the reference voltage generating circuit includes:
    a multiplexer configured to select one between the first MRS trim code and the first electric fuse trim code in response to a first trim control signal to output a first trim code; and
    a reference voltage generator configured to generate the internal reference voltage, the voltage level of the internal reference voltage being changed in response to the first trim code.

11. The non-volatile semiconductor memory device of claim 2, wherein the internal clock signal generating circuit includes:
    a delay line configured to delay an external clock signal, and configured to generate a plurality of delay clock signals;
    a first multiplexer configured to select one between the second MRS trim code and the second electric fuse trim code in response to a second trim control signal to output a second trim code; and
    a second multiplexer configured to select one among the delay clock signals in response to the second trim code to generate the internal clock signal.

12. The non-volatile semiconductor memory device of claim 11, wherein the delay line includes unit delay cells having a cascade-connected structure, the unit delay cells being configured to delay a cell input signal for a unit delay time period.

13. The non-volatile semiconductor memory device of claim 12, wherein the delay line further includes:
    a first unit delay cell configured to delay the external clock signal for the unit delay time period to generate a first delay clock signal;
    a second unit delay cell configured to delay the first delay clock signal for the unit delay time period to generate a second delay clock signal;
    a third unit delay cell configured to delay the second delay clock signal for the unit delay time period to generate a third delay clock signal; and
    a fourth unit delay cell configured to delay the third delay clock signal for the unit delay time period to generate a fourth delay clock signal.

14. The non-volatile semiconductor memory device of claim 2, wherein the input circuit further includes:
    a second trim code generating circuit configured to generate the second MRS trim code and the second electric fuse trim code.

15. The non-volatile semiconductor memory device of claim 1, wherein the Input circuit further includes:
    an internal clock signal generating circuit configured to generate the internal clock signal in response to the second MRS trim code or the second electric fuse trim code, and
    wherein the reference voltage generating circuit is configured to generate the internal reference voltage in response to the first MRS trim code, the first electric fuse trim code, or an external reference voltage.

16. The non-volatile semiconductor memory device of claim 15, wherein the input buffer is turned off in response to an enable signal.

17. The non-volatile semiconductor memory device of claim 16, wherein the sampler includes:
    a D flip-flop configured to latch the second buffered input signal in response to the internal clock signal; and
    a buffer configured to buffer an output signal of the D flip-flop.

18. The non-volatile semiconductor memory device of claim 16, wherein the reference voltage generating circuit includes:
    a first multiplexer configured to select one between the first MRS trim code and the first electric fuse trim code in response to a first trim control signal to output a first trim code;
    a reference voltage generator configured to generate a first reference voltage, a voltage level of the first reference voltage being changed in response to the first trim code; and
    a second multiplexer configured to select between the external reference voltage and the first reference voltage in response to a reference voltage selection signal, and configured to generate the internal reference voltage.

19. The non-volatile semiconductor memory device of claim 16, wherein the internal clock signal generating circuit includes:
    a delay line configured to delay an external clock signal, and configured to generate a plurality of delay clock signals;
    a first multiplexer configured to select one between the second MRS trim code and the second electric fuse trim code in response to a second trim control signal to output a second trim code; and
    a second multiplexer configured to select one among the delay clock signals in response to the second trim code to generate the internal clock signal.

20. The non-volatile semiconductor memory device of claim 1, wherein the input buffer is turned off in response to an enable signal.

21. The non-volatile semiconductor memory device of claim 20, wherein the reference voltage generating circuit includes:
    a multiplexer configured to select one between the first MRS trim code and the first electric fuse trim code In response to a first trim control signal to output a first trim code; and
    a reference voltage generator configured to generate the internal reference voltage, the voltage level of the internal reference voltage being changed in response to the first trim code.

22. The non-volatile semiconductor memory device of claim 1, wherein the trim code generating circuit includes:
    a decoder configured to decode an MRS trim update signal;
    a first register configured to store an MRS trim code, and configured to output the MRS trim code in response to an MRS trim enable signal;
    a second register configured to store the MRS trim code, and configured to output the MRS trim code in response to the MRS trim update signal;
    a word-line driving circuit configured to provide the MRS trim code to a non-volatile memory cell in response to the MRS trim update signal;
    a sense amplifier configured to amplify a first voltage signal corresponding to the MRS trim code of the non-volatile memory cell, and configured to generate a first data; and
    a third register configured to store the first data, and configured to generate an electric fuse trim code.

23. The non-volatile semiconductor memory device of claim 22, wherein the first trim code generating circuit further includes:

an MRS logic circuit configured to generate the MRS trim enable signal, the MRS trim update signal, and the MRS trim code in response to command signals.

24. A method of inputting data into a non-volatile semiconductor memory device, comprising:
- generating an internal reference voltage in response to a first Mode Register Set (MRS) trim code and a first electric fuse trim code;
- generating an internal clock signal in response to a second MRS trim code and a second electric fuse trim code;
- generating a second buffered input signal by buffering an input signal in response to the internal reference voltage; and
- generating a first buffered input signal by sampling the second buffered input signal in response to the internal clock signal.

25. The method of claim 24, wherein generating the internal reference voltage includes:
- trimming the internal reference voltage;
- receiving the input signal;
- determining whether the input signal that is received is correct;
- repeating the trimming the internal reference voltage, the receiving the input signal, and the determining whether the input signal that is received Is correct, when the input signal that is received is incorrect;
- storing a final trim code in a register when the input signal that is received is correct; and
- writing the final trim code into a non-volatile semiconductor memory cell.

26. The method of claim 24, wherein generating the internal clock signal includes:
- trimming the internal clock signal;
- receiving the input signal;
- determining whether the input signal that is received is correct;
- repeating the trimming the internal clock signal, the receiving the input signal, and the determining whether the input signal that is received is correct, when the input signal that is received is incorrect;
- storing a final trim code in a register when the input signal that is received is correct; and
- writing the final trim code into a non-volatile semiconductor memory cell.

27. An input circuit for a non-volatile semiconductor memory device, comprising:
- an input buffer configured to buffer an input signal in response to an internal reference voltage, and configured to generate a first buffered input signal;
- a sampler configured to sample the first buffered input signal in response to an internal clock signal, and configured to generate a second buffered input signal;
- a reference voltage generating circuit configured to generate the internal reference voltage in response to a first Mode Register Set (MRS) trim code or a first electric fuse trim code; and
- a first trim code generating circuit configured to generate the first MRS trim code and the first electric fuse trim code.

28. The input circuit of claim 24, further comprising:
- an internal clock signal generating circuit configured to generate the internal clock signal in response to a second MRS trim code or a second electric fuse trim code; and
- a second trim code generating circuit configured to generate the second MRS trim code and the second electric fuse trim code.

* * * * *